(12) United States Patent (10) Patent No.: US 7,742,346 B2
Chen (45) Date of Patent: Jun. 22, 2010

(54) VOLTAGE BOOSTER AND MEMORY STRUCTURE USING THE SAME

(75) Inventor: Chih-Jen Chen, Kaohsiung County (TW)

(73) Assignee: Nanya Technology Corporation, Taoyuan (TW)

(*) Notice: Subject to any disclaimer, the term of this patent is extended or adjusted under 35 U.S.C. 154(b) by 237 days.

(21) Appl. No.: 11/842,961

(22) Filed: Aug. 22, 2007

(65) Prior Publication Data

US 2008/0266998 A1 Oct. 30, 2008

(30) Foreign Application Priority Data

Apr. 24, 2007 (TW) .............. 96114410 A

(51) Int. Cl.
*G11C 5/14* (2006.01)
(52) U.S. Cl. .......... 365/189.09; 365/226; 365/227; 365/229; 365/230.06; 365/189.11; 365/185.23
(58) Field of Classification Search ............ 365/189.09, 365/226, 227, 229, 230.06, 189.11, 185.23
See application file for complete search history.

(56) References Cited

U.S. PATENT DOCUMENTS

| | | | |
|---|---|---|---|
| 5,291,446 A * | 3/1994 | Van Buskirk et al. .. | 365/189.09 |
| 6,041,012 A | 3/2000 | Banba et al. | |
| 6,373,753 B1 | 4/2002 | Proebsting | |
| 6,909,660 B2 * | 6/2005 | Oh ............................. | 365/229 |
| 6,912,155 B2 * | 6/2005 | Sakurai et al. .......... | 365/185.02 |

FOREIGN PATENT DOCUMENTS

| | | |
|---|---|---|
| CN | 1467748 | 1/2004 |
| CN | 1945738 | 4/2007 |

OTHER PUBLICATIONS

"1st Office Action of China counterpart application", issued on May 22, 2009, p. 1-p. 6.
"Office Action of Taiwan counterpart application", issued on Mar. 26, 2010, p. 1-p. 5.

* cited by examiner

*Primary Examiner*—VanThu Nguyen
*Assistant Examiner*—Eric Wendler
(74) *Attorney, Agent, or Firm*—Jianq Chyun IP Office

(57) ABSTRACT

A voltage booster and a memory structure using the same are provided. When a data storage unit in the memory structure is in normal operation, all voltage pumps in the voltage booster are turned on for boosting a supply voltage. However, when the data storage unit is in standby state, in the voltage booster, some voltage pumps are turned on while other voltage pumps are turned off, for boosting the supply voltage. Accordingly, the standby current and power consumption are reduced and the pump efficiency is improved.

12 Claims, 4 Drawing Sheets

VOLTAGE BOOSTER AND MEMORY STRUCTURE USING THE SAME

CROSS-REFERENCE TO RELATED APPLICATION

This application claims the priority benefit of Taiwan application serial no. 96114410, filed Apr. 24, 2007. All disclosure of the Taiwan application is incorporated herein by reference.

BACKGROUND OF THE INVENTION

1. Field of the Invention

The present invention generally relates to a memory structure, in particular, to a memory structure having reduced standby current and low power consumption.

2. Description of Related Art

Dynamic random access memory (DRAM) is adopted in many electronic system products as the optimal and indispensable memory solution due to its advantages of low cost and large volume. Presently, DRAM is mainly used in information products, such as desktop computers, notebook computers, DRAM upgrade modules, servers, and workstations etc.

Supply voltage VDD in DRAM has been lowered along with the advancement of fabricating process and increasing demand to low power consumption. However, voltage VPP for turning on word lines in memory cells is still higher than the supply voltage VDD. Accordingly, a voltage booster is required for boosting the supply voltage VDD up to the word line voltage VPP.

Generally speaking, a voltage booster includes a plurality of voltage pumps. Since the supply voltage VDD is being developed lower and lower, the number of voltage pumps used for voltage boosting is getting more and more. However, a large number of voltage pumps may reduce pump efficiency. Pump efficiency PE is defined as following:

$$PE = I\_VPP/I\_VDD \quad (1)$$

In the above formula, I_VDD represents current provided by the power supply, and I_VPP represents current provided by the voltage pumps.

In addition, a memory which is not in operation will be switched to a standby state so as to reduce the power consumption thereof. A high standby current also causes unnecessary power consumption when a memory is in standby state. Moreover, reduced pump efficiency may further increase the standby current and accordingly the power consumption.

Accordingly, a voltage booster having high pump efficiency, low standby current, and reduced power consumption and a memory structure using the voltage booster are provided by the present invention.

SUMMARY OF THE INVENTION

Accordingly, the present invention is directed to a memory structure and a voltage booster therein, wherein when a data storage unit in the memory structure enters standby state, some voltage pumps in the voltage booster are turned off in order to reduce standby current and power consumption and to increase pump efficiency.

According to an embodiment of the present invention, a memory structure is provided. The memory structure includes a first voltage booster, a second voltage booster, a control circuit, a word line driving circuit, and a data storage unit. The first voltage booster includes a plurality of voltage pumps and generates a first reference voltage. The second voltage booster generates a second reference voltage. The control circuit generates an enabling signal according to an address signal and an active signal. The word line driving circuit boosts the voltage level of the enabling signal to the first reference voltage or the second reference voltage. Operation stages of the data storage unit are according to the enabling signal boosted by the word line driving circuit. When the data storage unit is in standby state, some of the voltage pumps are turned off in order to reduce the standby current and power consumption of the memory structure.

According to another embodiment of the present invention, at least one of the first voltage booster and the second voltage booster includes at least one first stage voltage pump, at least one second stage voltage pump, and a switch. The first stage voltage pump includes a first pump circuit, and the first pump circuit transfers electronic charges from a supply voltage to a first node voltage. The second stage voltage pump is coupled to the first stage voltage pump. The second stage voltage pump includes a second pump circuit, a third pump circuit, and an enabling circuit. The enabling circuit controls on or off state of the third pump circuit according to an active signal. The second pump circuit transfers electronic charges from the first node voltage to a second node voltage. The switch is coupled to the second stage voltage pump. When the third pump circuit is in normal operation, the third pump circuit transfers electronic charges from the second node voltage to an output voltage. When the third pump circuit is turned off, the switch conducts the second node voltage as the output voltage, and the current of the output voltage is provided by the second pump circuit. The voltage level of the output voltage remains the same regardless of operation states of the third pump circuit.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
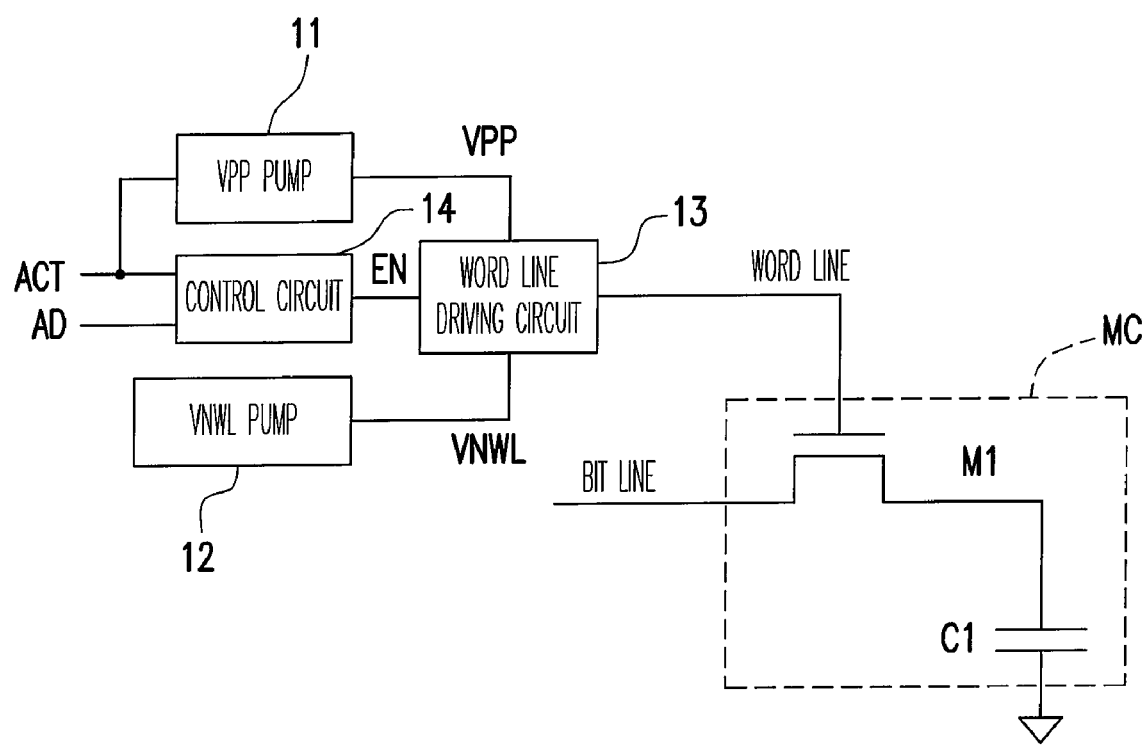
FIG. 1 is a diagram of a memory cell applying voltage pumps according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

In embodiments of the present invention, when a data storage unit (for example, a memory cell) in a memory enters into standby state, some voltage pumps in a voltage booster are turned off in order to reduce the standby current and power consumption of the data storage unit and to increase the efficiency of the circuit. Accordingly, the standby current of the memory can be reduced effectively and the pump efficiency of the voltage booster can be improved even if the same leak currents.

FIG. 1 is a diagram of a memory cell applying voltage pumps according to an embodiment of the present invention. Referring to FIG. 1, a memory cell MC including a transistor M1 and a capacitor C1 is illustrated as an example. However, it should be understood by those skilled in the art that without departing the scope and spirit of the present invention, embodiments of the present invention may also be implemented in memory cells with other structures.

A VPP pump 11 is used for generating a word line positive voltage VPP, and a VNWL pump 12 is used for generating a word line negative voltage VNWL. The word line positive voltage VPP generated by the VPP pump 11 and the word line negative voltage VNWL generated by the VNWL pump 12 are sent to a word line driving circuit 13.

When voltage level of an enabling signal EN (generated by a control circuit 14) is lower than the word line positive voltage VPP (when the enabling signal EN is at a logic high level) or the word line negative voltage VNWL (when the enabling signal EN is at a logic low level), the word line driving circuit 13 may boost the enabling signal EN to the word line positive voltage VPP (when the enabling signal EN is at a logic high level) or the word line negative voltage VNWL (when the enabling signal EN is at a logic low level). By boosting the enabling signal EN, the operation speed of the transistor (for example, the transistor M1) in the memory cell MC can be improved.

The control circuit 14 generates the enabling signal EN according to an address signal AD and an active signal ACT. The address signal AD represents which memory cell is addressed (data to be written into this memory cell). The active signal ACT is related to the operation of a voltage pump (for example, the VPP pump 11). For example, the active signal ACT may be used as a control signal of the voltage pump (for example, the VPP pump 11) for controlling the operation state of the voltage pump.

Figure 2:
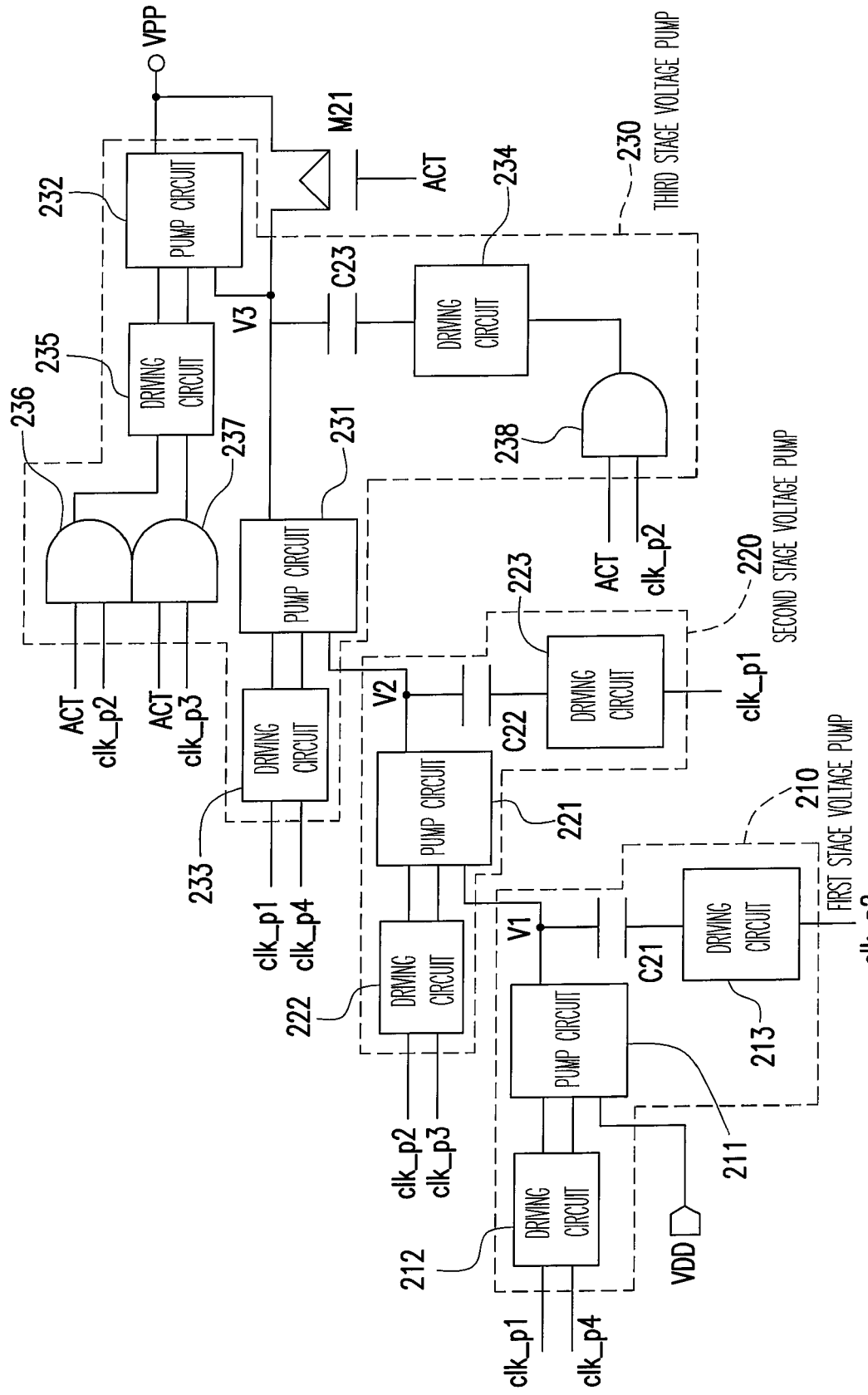
FIG. 2 is a diagram of a word line voltage pump according to the embodiment of the present invention.

FIG. 2 is a diagram of a word line voltage pump according to the embodiment of the present invention. Here the word line voltage (VPP) pump 11 includes three voltage pumps demonstratively. However, embodiments of the present invention are not limited thereto, and more or less voltage pumps may be used in embodiments of the present invention.

In the present embodiment, all the voltage pumps are in normal operation (boosting) states when the memory cell is in normal operation state; however, when the memory cell is in standby state, one or more voltage pumps are still in normal operation (boosting) states while the other voltage pumps are turned off. With the three voltage pumps in FIG. 2 as example, all the voltage pumps 210, 220, and 230 are in normal operation (boosting) states when the memory cell is in operation state; however, when the memory cell is in standby state, the voltage pumps 210 and 220 are in normal operation (boosting) states while the voltage pump 230 is turned off.

As shown in FIG. 2, in the present embodiment, the VPP pump 11 includes three voltage pumps 210, 220, 230 and a transistor M21. The voltage pump 210 includes a pump circuit 211, driving circuits 212 and 213, and a capacitor C21. The voltage pump 220 includes a pump circuit 221, driving circuits 222 and 223, and a capacitor C22. The voltage pump 230 includes pump circuits 231 and 232, driving circuits 233, 234, and 235, a capacitor C23, and logic gates 236, 237, and 238. In the present embodiment, the pump circuits (for example, the circuits 211, 221, 231, and 232) are used for transferring the electronic charges of the input terminals thereof to the output terminals thereof. The capacitors (for example, the capacitors C21~C23) are used for boosting output voltages of the corresponding pump circuits (through capacitor coupling effect).

The driving circuit 212 has two input terminals respectively receiving pulse signals clk_p1 and clk_p4, and two output terminals respectively coupled to two input terminals of the pump circuit 211. The pump circuit 211 has three input terminals and an output terminal, wherein two input terminals are respectively coupled to the two output terminals of the driving circuit 212, another input terminal receives a supply voltage VDD, and the output terminal thereof is coupled to one terminal (i.e. the node voltage V1) of the capacitor C21. The driving circuit 213 has an input terminal for receiving a pulse signal clk_p2 and an output terminal coupled to the other terminal of the capacitor C21. The two terminals of the capacitor C21 are respectively coupled to the output terminal (i.e. the node voltage V1) of the pump circuit 211 and the output terminal of the driving circuit 213.

The driving circuit 222 has two input terminals respectively receiving pulse signals clk_p2 and clk_p3, and two output terminals respectively coupled to two input terminal of the pump circuit 221. The pump circuit 221 has three input terminals and an output terminal, wherein two input terminals are respectively coupled to the two output terminals of the driving circuit 222, another input terminal receives the node voltage V1, and the output terminal thereof is coupled to a terminal of the capacitor C22. The driving circuit 223 has an input terminal for receiving the pulse signal clk_p1 and an output terminal coupled to the other terminal of the capacitor C22. The two terminals of the capacitor C22 are respectively coupled to the output terminal (i.e. the node voltage V2) of the pump circuit 221 and the output terminal of the driving circuit 223.

The driving circuit 233 has two input terminals respectively receiving pulse signals clk_p1 and clk_p4, and two output terminals respectively coupled to two input terminals of the pump circuit 231. The pump circuit 231 has three input terminals and an output terminal, wherein two input terminals are respectively coupled to the two output terminals of the driving circuit 233, another input terminal receives the node voltage V2, and the output terminal thereof is coupled to a terminal (i.e. the node voltage V3) of the capacitor C23 and an input terminal of the pump circuit 232. The driving circuit 234 has an input terminal for receiving the output signal of the logic gate 238, and an output terminal coupled to the other terminal of the capacitor C23. The two terminals of the capacitor C23 are respectively coupled to the output terminal (i.e. the node voltage V3) of the pump circuit 231 and the output terminal of the driving circuit 234. The logic gate 238 has two input terminal respectively receiving the active signal ACT and the pulse signal clk_p2, and an output terminal coupled to the input terminal of the driving circuit 234. The logic gate 236 has two input terminals respectively receiving the active signal ACT and the pulse signal clk_p2, and an output terminal coupled to one of the input terminals of the driving circuit 235. The logic gate 237 has two input terminals respectively receiving the active signal ACT and the pulse signal clk_{13}p3, and an output terminal coupled to the other input terminal of the driving circuit 235. The driving circuit 235 has two input terminals respectively coupled to the output terminals of the logic gates 236 and 237, and two output terminals coupled to two input terminals of the pump circuit 232. The pump circuit 232 has three input terminals and an output terminal, wherein two input terminals are respectively coupled to the two output terminals of the driving circuit 235, another input terminal receives the node voltage V3, and the output terminal thereof is coupled to the output terminal VPP.

The transistor M21 has a source coupled to the node voltage V3, a gate receiving the active signal ACT, and a drain coupled to the output terminal VPP.

In the present embodiment, a driving circuit (for example, the driving circuit 212, 213, 222, 223, 233, 234, or 235) may include a plurality of buffers connected in series for enhancing driving capability thereof. In the first stage voltage pump 210, the driving circuit 212 is used for enhancing the driving capabilities of the pulse signals clk_p1 and clk_p4, and the driving circuit 213 is used for enhancing the driving capability of the pulse signal clk_p2. In the second stage voltage pump 220, the driving circuit 222 is used for enhancing the driving capabilities of the pulse signals clk_p2 and clk_p3, and the driving circuit 223 is used for enhancing the driving capability of the pulse signal clk_p1. In the third stage voltage pump 230, the driving circuit 233 is used for enhancing the driving capabilities of the pulse signals clk_p1 and clk_p4, the driving circuit 234 is used for enhancing the driving capability of the output signal of the logic gate 238, and the driving circuit 235 is used for enhancing the driving capabilities of the output signals of the logic gates 236 and 237.

In the present embodiment, the pump circuits 211, 221, 231, and 232 are used for transferring electronic charges from the input terminals thereof to the output terminals thereof, and the boosting capabilities thereof are determined by the structures of the pump circuits and the capacitors C21, C22, and C23.

In the present embodiment, the output signals of the driving circuits 213, 223, and 234 may be coupled to the output voltages of the pump circuits 211, 221, and 231 through the coupling effect of the capacitors C21, C22, and C23. In other words, the output voltages of the pump circuit 211, 221, and 231 may be boosted through the coupling effect of the capacitors C21, C22, and C23.

In the first stage voltage pump 210, the pump circuit 211 transfers electronic charges from the low supply voltage VDD to the node voltage V1, and then the node voltage V1 is boosted through the coupling effect of the capacitor C21. The voltage level of the node voltage V1 is substantially higher than the low supply voltage VDD, which means that the first stage voltage pump 210 boosts the low supply voltage VDD to the node voltage V1.

Similarly, in the second stage voltage pump 220, the pump circuit 221 transfers electronic charges from the node voltage V1 to the node voltage V2, and then the node voltage V2 is farther boosted through the coupling effect of the capacitor C22. The voltage level of the node voltage V2 is substantially higher than the node voltage V1, which means that the second stage voltage pump 220 boosts the node voltage V1 to the node voltage V2.

Similarly, in the third stage voltage pump 230, the pump circuit 231 transfers electronic charges from the node voltage V2 to the node voltage V3, and then the node voltage V3 is further boosted through the coupling effect of the capacitor C23. The voltage level of the node voltage V3 is substantially higher than the node voltage V2.

When the memory cell is in normal operation (here the active signal ACT is at a logic high level), the driving circuit 235 and the pump circuit 232 are both in normal operation. The pump circuit 232 transfers electronic charges from the node voltage V3 to the output voltage VPP, and the transistor M21 is turned off. Namely, the current of the output voltage VPP is provided by the pump circuit 232.

When the memory cell is in standby state (here the active signal ACT is at a logic low level), the output signals of the logic gates 236, 237, and 238 are all at logic low level. These output signals of the logic gates 236, 237, and 238 at logic low level turn the driving circuits 234 and 235 and the pump circuit 232 off. However, the transistor M21 is turned on because the active signal ACT is at a logic low level. Accordingly, the current of the output voltage VPP is provided by the pump circuit 231, and since the pump circuit 232 and the driving circuits 234 and 235 are all turned off, the power consumption is reduced.

In addition, theoretically, the voltage level of the output voltage VPP remains the same regardless of states (normal stage or standby state) of the memory cell.

In the present embodiment, the logic state of the active signal ACT is related to the operation state of the memory cell. For example, the active signal ACT is at logic high level when the memory cell is in normal operation state, and the active signal ACT is at a logic low level when the memory cell is in standby state; however, the present invention is not limited thereto.

Those skilled in the art may also make other variations of the present embodiment by changing the structure of the present embodiment illustrated in FIG. 2. For example, in alternative embodiments, when the memory cell is in normal operation, all the voltage pumps 210, 220, and 230 are in normal operation (boosting) states, and when the memory cell is in standby state, the voltage pump 210 is in normal operation state (for example, boosting) while the voltage pumps 220 and 230 are turned off.

Besides, even the third voltage pump 230 in FIG. 2 includes two pump circuits 231 and 232, it should be understood by those skilled in the art that the third voltage pump 230 may also have other structures. For example, the third voltage pump 230 may include only a single pump circuit.

In short, in FIG. 2, when the active signal ACT is at logic high level, the current of the output voltage VPP is provided by the pump circuit 232, and when the active signal ACT is at logic low level, the current of the output voltage VPP is provided by the pump circuit 231.

Figure 3:
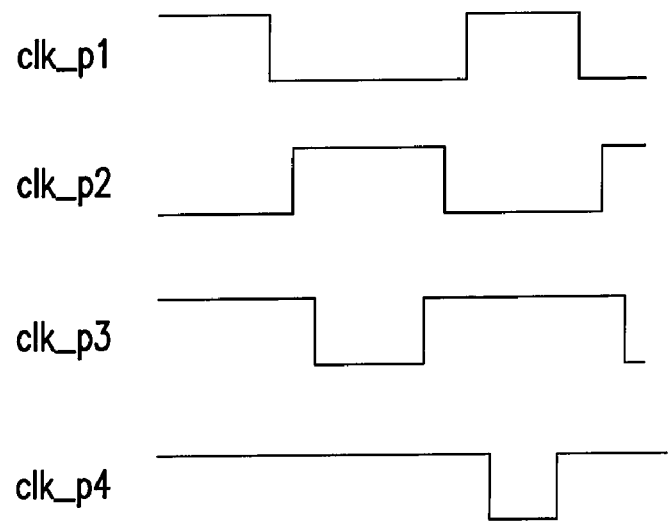
FIG. 3 is a timing diagram of pulse signals in the embodiment of the present invention.

FIG. 3 is a timing diagram of pulse signals clk_p1~clk_p4 in the embodiment of the present invention. It should be understood by those skilled in the art that the timing diagram of the pulse signals clk_p1~clk_p4 illustrated in FIG. 3 is only one example of the present invention, and those skilled in the art should be able to deduce other possible timing relationships of the pulse signals clk_p1~clk_p4 from foregoing descriptions.

Figure 4:
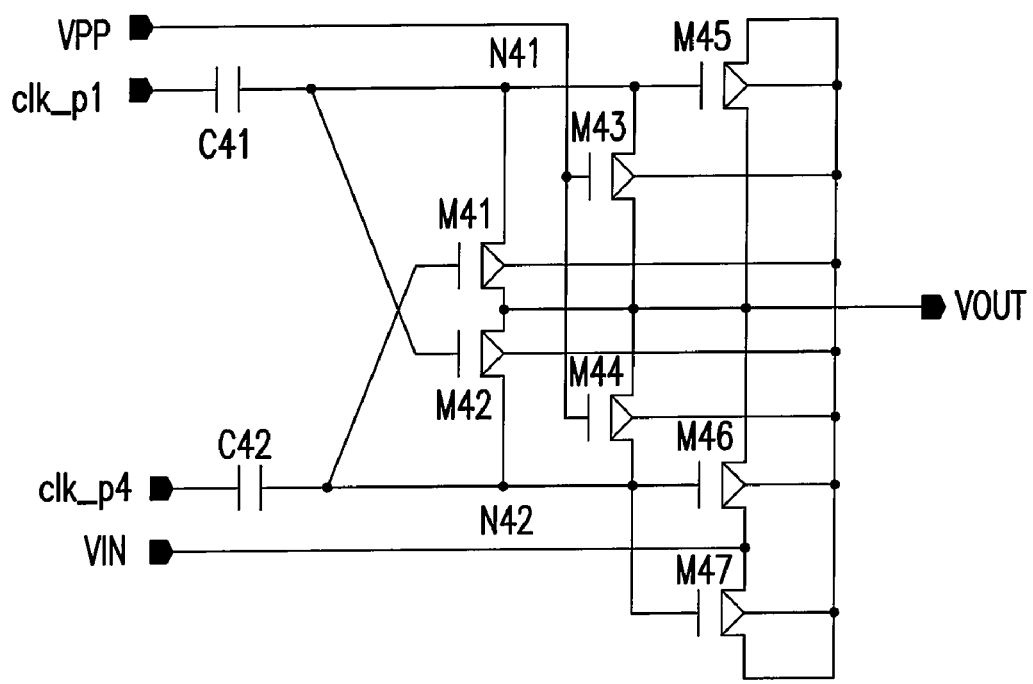
FIG. 4 is a diagram of a pump circuit according to the embodiment of the present invention.

FIG. 4 is a diagram of a pump circuit according to the embodiment of the present invention. Or, those skilled in the art should be able to deduce other types of pump circuits from the structured illustrated in FIG. 4. Or those skilled in the art may even apply other types of pump circuits in embodiments of the present invention without departing the spirit-and scope of the present invention.

As shown in FIG. 4, the pump circuit includes at least capacitors C41~C42 and transistors M41~M47. The couplings between the capacitors C41~C42 and the transistors M41~M47 are as illustrated in FIG. 4 therefore will not be described herein. The pulse signals clk_p1 and clk_p4 may be coupled to the node voltages N41 and N42 through coupling effect of the capacitors C41~C42. The node voltages N41 and N42 may even be boosted up to about two times of VDD through the coupling effect of the capacitors C41~C42 if the high voltage level of pulse signals clk_p1 and clk_p4 is about equal to VDD.

Besides, in FIG. 4, the word line voltage VPP may be further conducted to the gates of the transistors M43 and M44 in order to increase the operation speed of the pump circuit.

Below, a word line voltage pump including three voltage pumps will be described as an example for comparing the conventional technique and the present invention. In conventional technique, the three voltage pumps are all in normal operation states regardless of operation state of the memory cell, therefore the standby current is high. However, in the present embodiment, the active signal ACT is used for controlling the operation states of the voltage pumps. In the present embodiment, all the three voltage pumps are in normal operation when the memory cell is in normal operation state, and when the memory cell is in standby state, some of the voltage pumps are in normal operation state while the other voltage pumps are turned off. Accordingly, the standby current of the memory cell can be effectively reduced with the same VPP leakage current.

The performance of the present embodiment will be explained below, wherein, demonstratively, VDD is 1.5V and VPP is 2.6V. In conventional technique, the three voltage pumps are all in normal operation states regardless of operation state of the memory cell, and the output current of the pumps is 4.9 mA and the pump efficiency thereof is 21%. While in the present embodiment, the three voltage pumps are in normal operation states when the memory cell is in normal operation state, and here the output current is 4.9 mA and the pump efficiency is 21%. When the memory cell is in standby state, only the first two stage voltage pumps are in operation while the last stage voltage pump is turned off, and here the output current is 3.7 mA and the pump efficiency is 28%. It is assumed that the VPP leakage current is 1 mA when the memory cell is in standby state. The standby current is 1/0.21=4.8 (mA) when the pump efficiency is 21%, while the standby current is 1/0.28=3.6 (mA) when the pump efficiency is 28%. It can be observed from the present embodiment that the standby current and accordingly the power consumption are reduced.

Figure 5:
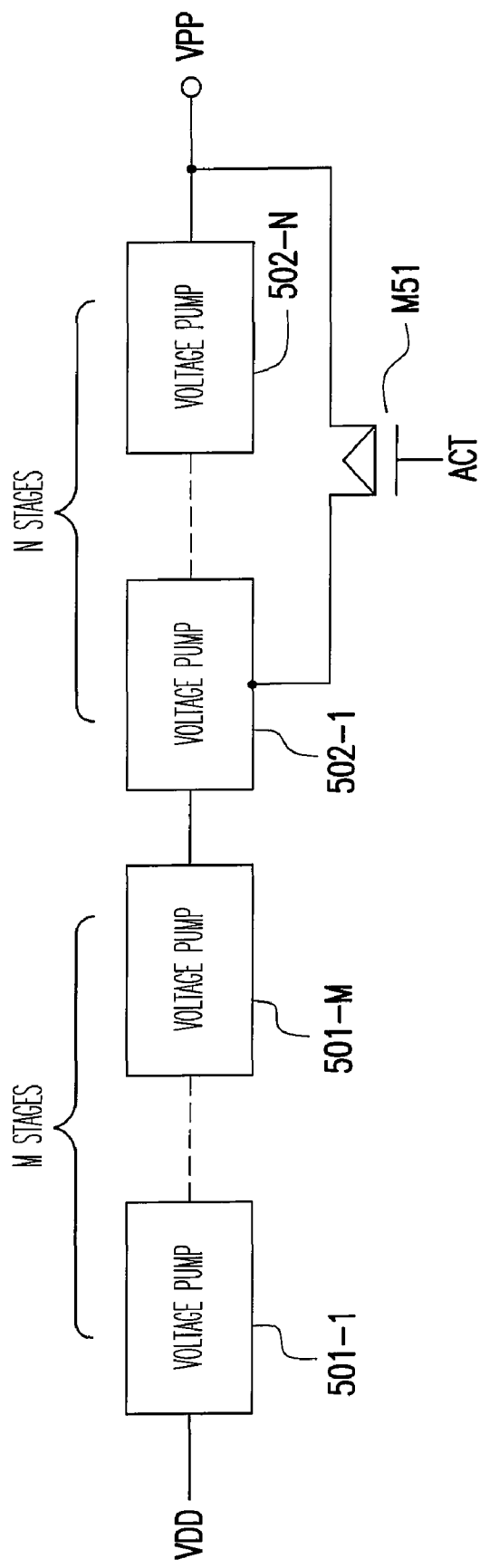
FIG. 5 is a diagram of a word line voltage pump according to another embodiment of the present invention.

It should be understood by those skilled in the art from foregoing description that the present invention may also be applied to a voltage booster having N+M voltage pump stages, wherein N and M are both positive integers. All N+M voltage pump stages are in normal operation when the memory cell is in operation state, while the (first) M voltage pump stages are in normal operation and the (last) N voltage pump stages are turned off when the memory cell is in standby state. Referring to FIG. 5, the word line voltage pump includes M voltage pump stages 501-1~501-M, N voltage pump stages 502-1~502-N, and a transistor M51. The M voltage pump stages 501-1~501-M are in normal operation regardless of operation state of the memory cell. The structures of the M voltage pump stages 501-1~501-M may be the same as or similar to that of the voltage pumps 210 or 220 illustrated in FIG. 2. The N voltage pump stages 502-1~502-N are in normal operation when the memory cell is in normal operation state, and the N voltage pump stages 502-1~502-N are turned off when the memory cell is in standby state. The structures of the N voltage pump stages 502-1~502-N may be the same as or similar to that of the voltage pump 230 illustrated in FIG. 2. The transistor M51 is turned off when the memory cell is in normal operation state, and here the current of the output voltage VPP is generated by the last voltage pump stage 502-N. The transistor M51 is turned on when the memory cell is in standby state, and here the current of the output voltage VPP is generated by the voltage pump stage 501-M.

Besides, the application of the present embodiment is not restricted to DRAM, and the present embodiment may also be applied to other types of memories (for example, a flash memory). Moreover, the present embodiment may also be applied to other types of circuits, wherein the supply voltage is boosted to VPP regardless of operation stages of the memory cell.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A voltage booster, comprising:
    at least one first stage voltage pump, comprising a first pump circuit, wherein the first pump circuit transfers electronic charges from a supply voltage to a first node voltage;
    at least one second stage voltage pump, coupled to the first stage voltage pump, the second stage voltage pump comprising a second pump circuit, a third pump circuit, and an enabling circuit, wherein the enabling circuit controls on or off states of the third pump circuit according to an active signal, and the second pump circuit transfers electronic charges from the first node voltage to a second node voltage; and
    a switch, coupled to the second stage voltage pump;
    wherein when the third pump circuit is in normal operation, the third pump circuit transfers electronic charges from the second node voltage to an output voltage, and when the third pump circuit is turned off, the switch conducts the second node voltage as the output voltage, and the current of the output voltage is provided by the second pump circuit; and
    the first stage voltage pump further comprises:
    a first driving circuit, enhancing a first pulse signal and a second pulse signal and outputting the enhanced first pulse signal and the enhanced second pulse signal to the first pump circuit;
    a second driving circuit, enhancing a third pulse signal; and
    a first coupling element, coupling the third pulse signal enhanced by the second driving circuit to the first node voltage in order to boost the first node voltage.

2. The voltage booster according to claim 1, wherein the second stage voltage pump further comprises:
    a third driving circuit, enhancing the first pulse signal and the second pulse signal and outputting the enhanced first pulse signal and the enhanced second pulse signal to the second pump circuit;
    a first logic gate, determining whether or not to output the third pulse signal according to the active signal;
    a fourth driving circuit, coupled to the first logic gate and enhancing the third pulse signal output by the first logic gate; and
    a second coupling element, coupling the third pulse signal enhanced by the fourth driving circuit to the second node voltage in order to boost the second node voltage.

3. The voltage booster according to claim 1, wherein the switch comprises a transistor.

4. The voltage booster according to claim 2, wherein the enabling circuit comprises:
    a second logic gate, determining whether or not to output the third pulse signal according to the active signal; and
    a third logic gate, determining whether or not to output a fourth pulse signal according to the active signal.

5. The voltage booster according to claim 4, wherein the second stage voltage pump further comprises:
    a fifth driving circuit, coupled to the second logic gate and the third logic gate, the fifth driving circuit enhancing the third pulse signal and the fourth pulse signal output by the second logic gate and the third logic gate and outputting the third pulse signal and the fourth pulse signal to the third pump circuit.

6. A memory structure, comprising:

a first voltage booster, generating a word line positive voltage, the first voltage booster comprising a plurality of voltage pumps;

a second voltage booster, generating a word line negative voltage;

a control circuit, generating an enabling signal according to an address signal and an active signal;

a word line driving circuit, boosting the voltage level of the enabling signal to the word line positive voltage or the word line negative voltage according to the logic state of the enabling signal; and a data storage unit, being operated according to the enabling signal boosted by the word line driving circuit;

wherein when the data storage unit is in standby state, a portion of the voltage pumps in the first voltage booster, which is used for generating the word line positive voltage, are turned off in order to reduce a standby current of the memory structure.

7. The memory structure according to claim 6, wherein the voltage pumps of the first voltage booster comprise:

at least one first stage voltage pump, comprising a first pump circuit, wherein the first pump circuit transfers electronic charges from a supply voltage to a first node voltage;

at least one second stage voltage pump, coupled to the first stage voltage pump, the second stage voltage pump comprising a second pump circuit, a third pump circuit, and an enabling circuit, wherein the enabling circuit controls on or off states of the third pump circuit according to an active signal, and the second pump circuit transfers electronic charges from the first node voltage to a second node voltage; and a switch, coupled to the second stage voltage pump;

wherein when the third pump circuit is in normal operation, the third pump circuit transfers electronic charges from the second node voltage to an output voltage, and when the third pump circuit is turned off, the switch conducts the second node voltage as the output voltage, and the current of the output voltage is provided by the second pump circuit.

8. The memory structure according to claim 7, wherein the first stage voltage pump further comprises:

a first driving circuit, enhancing a first pulse signal and a second pulse signal and outputting the enhanced first pulse signal and the enhanced second pulse signal to the first pump circuit;

a second driving circuit, enhancing a third pulse signal; and a first coupling element, coupling the third pulse signal enhanced by the second driving circuit to the first node voltage in order to boost the first node voltage.

9. The memory structure according to claim 7, wherein the switch comprises a transistor.

10. The memory structure according to claim 8, wherein the second stage voltage pump further comprises:

a third driving circuit, enhancing the first pulse signal and the second pulse signal and outputting the enhanced first pulse signal and the enhanced second pulse signal to the second pump circuit;

a first logic gate, determining whether or not to output the third pulse signal according to the active signal;

a fourth driving circuit, coupled to the first logic gate, and enhancing the third pulse signal output by the first logic gate; and a second coupling element, coupling the third pulse signal enhanced by the fourth driving circuit to the second node voltage in order to boost the second node voltage.

11. The memory structure according to claim 10, wherein the enabling circuit comprises:

a second logic gate, determining whether or not to output the third pulse signal according to the active signal; and a third logic gate, determining whether or not to output a fourth pulse signal according to the active signal.

12. The memory structure according to claim 11, wherein the second stage voltage pump further comprises:

a fifth driving circuit, coupled to the second logic gate and the third logic gate, the fifth driving circuit enhancing the third pulse signal and the fourth pulse signal output by the second and the third logic gate and outputting the enhanced third pulse signal and the enhanced fourth pulse signal to the third pump circuit.

* * * * *